(12) United States Patent
Costello (10) Patent No.: US 6,969,839 B2
(45) Date of Patent: Nov. 29, 2005

(54) BACKTHINNED CMOS SENSOR WITH LOW FIXED PATTERN NOISE

(75) Inventor: Kenneth A Costello, Alameda, CA (US)

(73) Assignee: Intevac, Inc., Santa Clara, CA (US)

( * ) Notice: Subject to any disclaimer, the term of this patent is extended or adjusted under 35 U.S.C. 154(b) by 196 days.

(21) Appl. No.: 10/355,836

(22) Filed: Jan. 31, 2003

(65) Prior Publication Data

US 2004/0149888 A1    Aug. 5, 2004

(51) Int. Cl.[7] .............................................. H01L 31/00
(52) U.S. Cl. .................................... 250/214.1; 257/460
(58) Field of Search .......................... 250/214.1, 208.1; 257/228, 447, 460

(56) References Cited

U.S. PATENT DOCUMENTS

| | | |
|---|---|---|
| 4,687,922 A | 8/1987 | Lemonier et al. |
| 5,688,715 A | 11/1997 | Sexton et al. |
| 6,020,646 A | 2/2000 | Boyle et al. |
| 6,168,965 B1 | 1/2001 | Malinovich et al. |
| 6,169,319 B1 * | 1/2001 | Malinovich et al. ........ 257/447 |
| 6,285,018 B1 * | 9/2001 | Aebi et al. ............... 250/214.1 |
| 6,459,078 B1 | 10/2002 | Fowler |

* cited by examiner

*Primary Examiner*—Thanh X. Luu
(74) *Attorney, Agent, or Firm*—Stanley Z Cole (57) ABSTRACT

This invention deals with the reduction in fixed pattern noise in backthinned CMOS imagers primarily for use in a vacuum environment. Reduction is achieved by effectively shielding the imager. This is done by depositing a conductive layer on the front surface prior to the attachment of a support member or by incorporating a conductive layer into the die at least extensive with the analog circuitry. This also may be achieved by leaving a void adjacent to the analog circuitry area. This void, filled with air or a vacuum specifies a low dielectric layer over critical analog circuitry. Finally there is extended across the die an adhesive or underfill material after which a support member is placed onto the underfill to provide structure to the die. The underfill and the support layer should have thermal coefficients of expansion that substantially match that of the silicon.

9 Claims, 8 Drawing Sheets

BACKTHINNED CMOS SENSOR WITH LOW FIXED PATTERN NOISE

FIELD OF THE INVENTION

The invention relates to backthinned and backthinning of CMOS imaging sensors for use in a vacuum environment.

BACKGROUND OF THE INVENTION

Backthinning of CMOS sensors provide certain advantages. These can include performance advantages such as improved light sensitivity as a result of improved effective fill factor and sensitivity to UV light or low energy electrons. Although processes that work with CCD sensors do not routinely transfer to the manufacture or structure of CMOS sensors, some do and are beneficial to consider and to use. For example, when properly passivated by a method such as that described in U.S. Pat. No. 5,688,715 which is applicable to CCDs, backthinned CMOS sensors also demonstrate high sensitivity to both UV light and low energy (~0.5–20 keV) electrons. This property of backthinned CMOS sensors makes them particularly suitable for use in a vacuum environment as a video based image intensifier. U.S. Pat. No. 6,285,018 B1 details the use of CMOS sensors including back thinned imagers in an electron-bombarded configuration.

Some degree of fixed pattern noise generally and typically occurs in backthinned CMOS sensors. Sources include baseline sensor fixed pattern noise and fixed pattern noise that is introduced as a result of the back-thinning process. Back-thinned CMOS sensors are fabricated by taking a sensor designed for front side use and processing it to remove the silicon substrate. Processing for substrate removal includes subjecting the backside to an grinding processes until the substrate is sufficiently thinned after which the remaining substrate is subjected to chemical etching. Frontside CMOS die manufacturers often quote residual fixed pattern noise of <0.5%. Processing induced fixed pattern noise however, can be significantly greater than that seen on bare die. Fixed pattern noise (FPN) can result from both pixel offset and gain variations. A more detailed discussion of FPN as it relates to CMOS sensors can be found in U.S. Pat. No. 6,459,078. Measured values are highly dependent on test conditions that can be crafted to highlight FPN introduced via specific mechanisms. This invention is focused upon minimizing backside-thinning process induced FPN in CMOS imagers.

Properties shared by CMOS sensors place them in a class that is distinct from CCDs thereby necessitating new procedures and manufacturing approaches. It has been found in practice that CMOS imagers from a range of manufacturers are all highly stressed. This may result from the numerous metal and dielectric layers that characterize the modern CMOS imager. CCDs in contrast to CMOS imagers often employ only a couple metal layers and much thinner dielectric layers. CCDs tested to date do not exhibit the high levels of residual stress seen in CMOS imagers. Consequently, when CMOS die are thinned without a support structure bonded to the front side, the device curls and often breaks. The window-frame configuration, successfully applied to commercial backthinned CCDs, where a thin ring of thick substrate is left around an unsupported image array is impractical on commercially available CMOS sensors as a result of this residual stress. Accordingly CMOS die require bonding to a support structure on the front surface before thinning of the backside occurs. A preferred support material is Code 7740/Pyrex glass. Other useful materials are materials that have a thermal coefficient of expansion that generally matches the die. Typical bonding agents are thermal coefficient of expansion matched frit glass for vacuum compatible die or epoxy for less demanding applications. U.S. Pat. Nos. 6,168,965 and 6,169,319 describe a backside-illuminated sensor and method of manufacturing the same. These patents (U.S. Pat. Nos. 6,168,965 and 6,169,319) however, result in a sensor that has a transparent substrate which is bonded to the backside surface as a support and which thereby prevents direct access by impinging electrons to the backside surface. Yet, in order for a CMOS imager to be useful in the application of primary interest, the back surface of the sensor must be available and accessible. A method for forming a supported imager assembly suitable for the application of interest is detailed in U.S. Pat. No. 6,020,646.

An application of this invention of primary interest is an embodiment where the backthinned CMOS sensor is thinned to a point where the entire backside is removed leaving only the epitaxally grown silicon on the die. Backthinning may be performed along the entire surface or may be limited to the area of the pixel array. The CMOS sensor is then processed to lower back surface dark current generation and increase sensitivity. The sensor is then mounted in a vacuum directly opposing a photocathode, also in the vacuum, in a proximity-focused configuration as described in U.S. Pat. No. 6,285,018. This arrangement will be more fully discussed in connection with FIG. 1.

Figure 1:
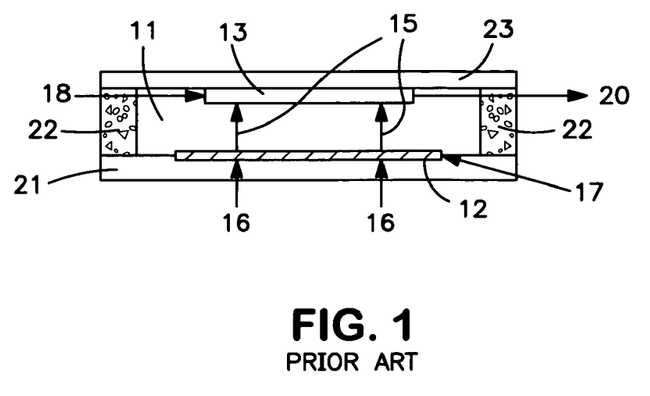
FIG. 1 is a schematic illustration of a backthinned CMOS sensor directly opposing a photocathode, both in vacuum, in a proximity-focused configuration as practiced in the prior art.

In attempting to operate the system shown in FIG. 1 at its best levels, as for example as a night vision imager, or in scientific studies involving low light levels, the images to be viewed are often captured at very low signal levels. When such images are displayed, residual fixed pattern noise associated with pixel offset is highlighted. At higher signal levels gain variance related FPN (fixed pattern noise) tends to dominate.

SUMMARY OF THE INVENTION

Two degradation mechanisms have been identified. A first such mechanism appears to primarily affect pixel offset. The effect is reversible and appears to increase in magnitude as the dielectric constant of the material coating the front surface of the CMOS sensor increases. The second source of fixed pattern noise is associated with nonuniformities in the underfill material. Nonuniformities in the underfill can result from voids or inconsistency in the fill material. When a backside thinned CMOS sensor or chip is exposed to weakly absorbed light, typically in the 800 to 1100 nm wavelength range, some light is partially transmitted through the sensor and is non-uniformly reflected or scattered at the interface between the surface of the die and the underfill layer. The areas of non-uniform reflection/scattering translate into a spatially non-uniform pixel gain and hence output when the sensor is uniformly illuminated. It is these fixed pattern noises that will be addressed in this invention. This will be done by novel manufacturing techniques and construction of the CMOS imager.

DETAILED DESCRIPTION OF THE INVENTION

In FIG. 1 there is shown a proximately focused configuration comprising a vacuum 11, a photocathode 12, such as, a GaAs or an InP/InGaAs transferred electron photocathode, in proximity focus with a specialized active pixel sensor chip 13 which forms the anode of the vacuum system. In accordance with this invention the active pixel sensor 13 is mounted with its backside facing photocathode 12. Photoelectrons 15 are emitted from photocathode 12 in response to incident light illustrated as arrows designated 16. These electrons are accelerated by an applied voltage to sufficient energy to allow impact ionization gain in the semiconductor (the epitaxally grown silicon on the back surface of the die that is also maintained after backthinning) underlying the active pixel sensor 13. The accelerating voltage 17 applied to the photocathode 12 is negative with respect to the chip. This permits biasing the chip to near or at ground to simplify interfacing with other components. Control signals and bias voltages 18 are applied to active pixel sensor 13 and a video output signal 20 is taken off sensor 13. At the base of the system shown in FIG. 1, is a transparent faceplate 21. Vacuum system sidewalls 22 extend between the transparent faceplate 21 and header assembly 23, on which the active pixel sensor chip is positioned. A photocathode 12 is positioned on the transparent faceplate on the surface in the vacuum side. The header assembly 23, also provides means for electrical feedthroughs for applying voltage 18 to the active pixel sensor chip. Any of various known projection systems may be used to place an image onto photocathode 12.

In order to better understand the form of degradation associated with the application of a high dielectric coating, a small drop of a high dielectric constant liquid (water) was placed on the front surface of the CMOS sensor and moved over various portions of the die. The fixed pattern noise peaked and vanished as the drop was moved over various portions of the die. This technique was used to map out those sections of the CMOS die that are adversely affected by a high dielectric constant coating. The section of the die that exhibited the greatest sensitivity to the high dielectric constant "coating" lay immediately off of the pixel array. The sensitive area on the first tested CMOS sensor mapped out as a strip of electronics that was positioned immediately adjacent to the active area that runs the entire length of the active area but constitutes <20% of the total die area. The position and size of this area may vary from one sensor type to another. This was later clarified as the area overlying the analogue support circuitry in the chip as discussed more thoroughly in connection with FIG. 2.

Figure 2:
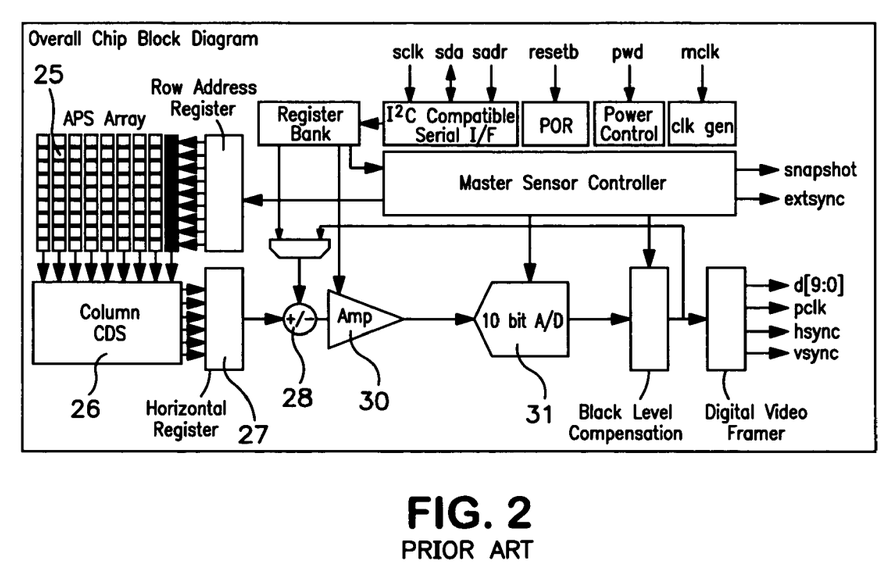
FIG. 2 is a block diagram of a CMOS imager as known in the art.

FIG. 2 is a block diagram of a chip or CMOS imager. In this Figure, data is read out of pixel array 25 into a Column CDS structure 26. The signal then passes through a horizontal register 27, a summing node 28 and an amplifier 30 before entering the analog to digital converter 31. This chain of circuitry can collectively be referred to as analog support circuitry. In general, fixed pattern noise, it has been found, is generated in the analog support circuitry of a CMOS imager. Once the signal is in digital form it appears to be relatively immune to interference. Thus, since FPN does not appear to be created by digital circuitry, the analog support circuitry is a prime target for the concerns of this invention.

Figure 3:
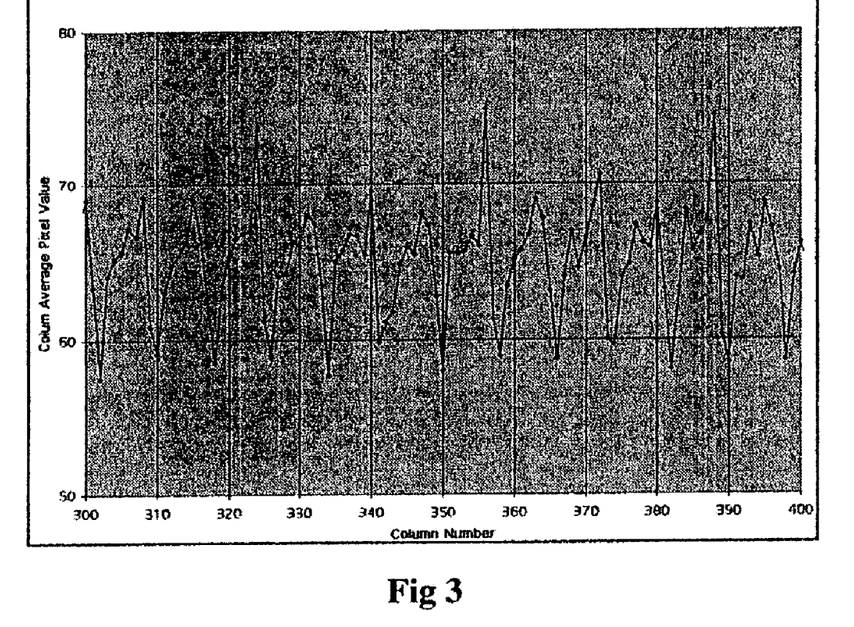
FIG. 3 is a plot of the average pixel value as a function of column number for a CMOS sensor that has been bonded to a glass support structure using a high dielectric glass frit.

Backside thinned CMOS sensors were fabricated without using the invention. The sensors used a leaded glass as the adhesive/underfill layer. This adhesive underfill layer exhibits a high dielectric constant. On these sensors the high dielectric constant coating induced repetitive vertical column FPN. FIG. 3 is a plot of the average dark pixel value as a function of column number for a CMOS sensor that has been bonded to a glass support structure using a high dielectric glass frit. The image from which the data was derived was captured in the dark and high gain settings were used in order to mimic the operational settings in low light applications. The repetitive column noise is clearly visible in the column-averaged pixel values. No discernable repetitive column noise is visible on CMOS die of this type when placed in a normal, face-up package.

Specific solutions to the problem of FPN as to improve image quality and avoid image degradation due to FPN in imaging using a backside thinned CMOS imager in a vacuum environment and particularly in connection with images at low light levels will now be discussed. A first approach involves creating a shield over sensitive areas with a conductive layer. A second approach is to maintain a low dielectric constant such as an air or vacuum gap over those areas of the die that are responsible for the FPN.

Figure 4:
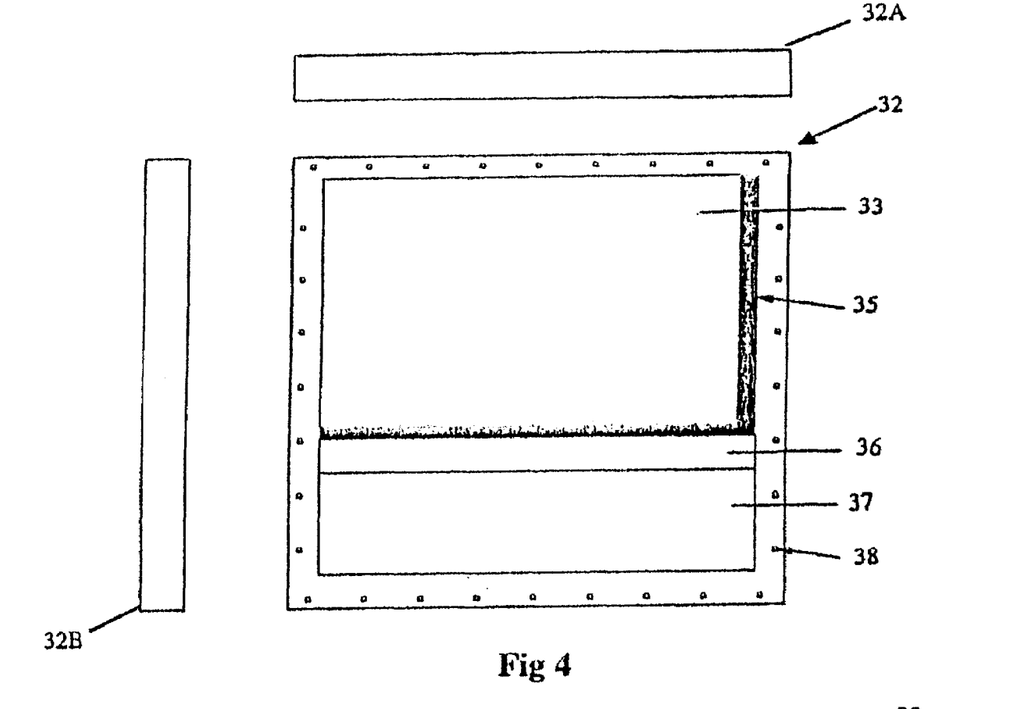
FIG. 4 is a showing of a CMOS die in three views.

Reference is now had to FIGS. 4 through 8 which show the construction of the support for the die to enable removal of the backside while maintaining the die as a viable device with no or substantially no discernible FPN for use in systems like that shown in FIG. 1. FIG. 4 illustrates an example of a CMOS die in three views. The die 32 shown in a frontside view is also shown in a top view 32A and in a side view 32B. The die comprises the area of the active pixel array 33 interspersed with metal coated reference pixels 35 which, because of the coating, do not show receipt of light and are used to define black as a reference point in the output image. The analog support electronics 36 and the digital support electronics 37 are, in this die, shown in the areas illustrated. Finally the bond pads 38 are positioned along the outer edge of the die. The die illustrated in FIG. 4 conforms to currently available die. However, if the die configuration is unknown, then its layout can be determined using the mapping technique described above.

Figure 5:
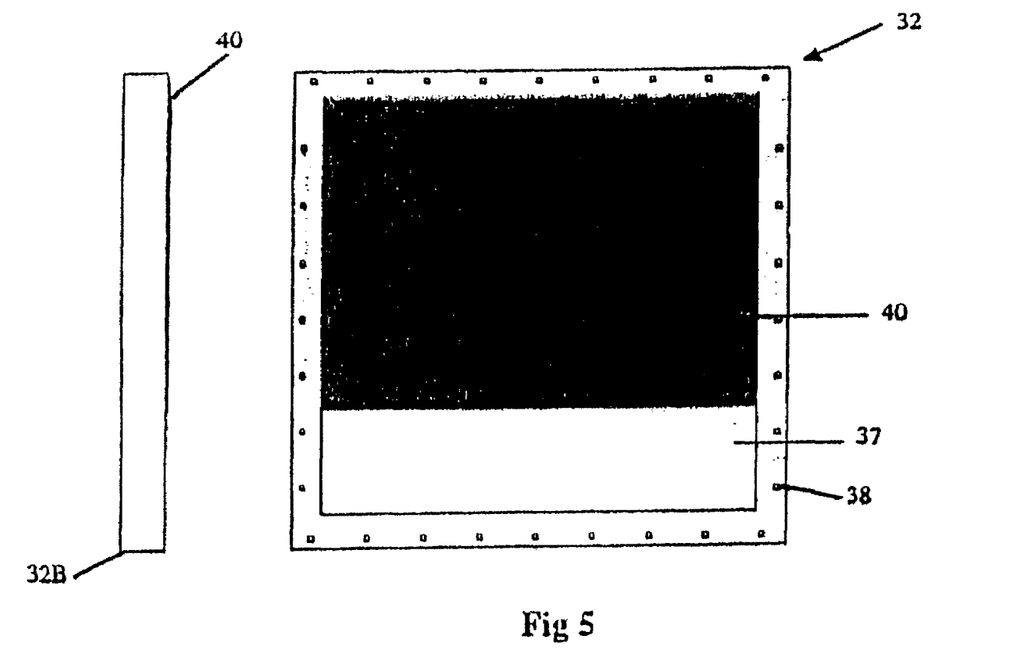
FIG. 5 is an illustration of a first stage in carrying out this invention by depositing a metallic coating on the die.
Figure 6:
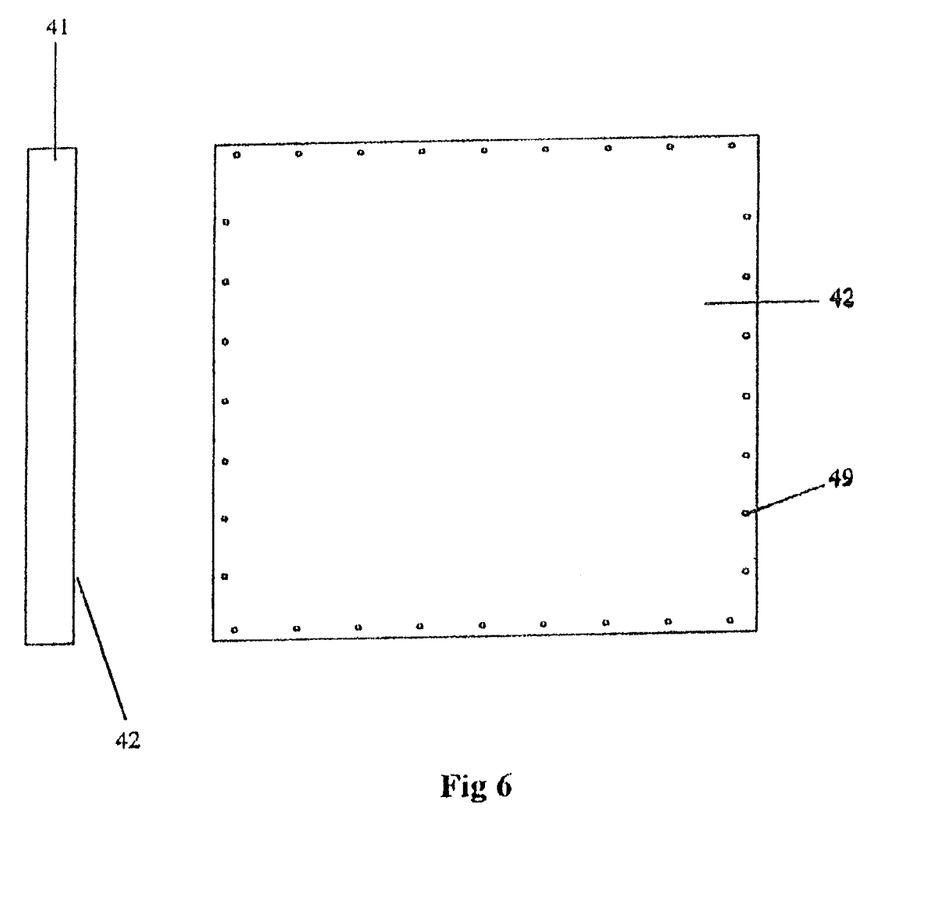
FIG. 6 is an illustration of the next stage in which an adhesive or underfill is attached to the support.

FIG. 5 illustrates the CMOS die looking at the frontside with a metallic coating 40 added to the front area of die 32 which overlays the pixel arrays 33 and 35 and the analog support electronics 36, shown covered in this Figure when compared to the showing in FIG. 4. The area of the digital support electronics 37 need not be covered with the metallic coating. A side view 32B is also illustrated in this Figure. The metallic coating is deposited to be thick enough to be conductive and may for example comprise any conductive metal of about a few hundred angstroms. One example of a metallic coating that has been used is about a 1,000 angstrom coating of aluminum. The metallic coating acts as a shield for the electronics of the chip and particularly so in the areas covered such as the active pixels and the analog support circuitry. In this illustration the coating is shown covering only these two areas of the die 32. Bond pads 38 can also be seen in this Figure, In FIG. 6 there is illustrated coating of a support substrate 41 with an adhesive 42 across its surface and with gold balls 49 attached. The adhesive 42 is selected to act as an underfill material. The adhesive is a high dielectric constant material such as a low melting point glass frit that has a thermal coefficient of expansion as to match the thermal coefficient of expansion of silicon, the material on which the die was originally formed and which constitutes the backside of the die. The adhesive may be an epoxy for non vacuum applications of the die. The support structure 41 is glass. It too should have a thermal coefficient that matches or approximately matches silicon and may comprise glass such as a 7740 glass or a 7070 glass. A Pyrex glass appears to work well for this application. Gold balls 49 now cover the bond pads.

Figure 7:
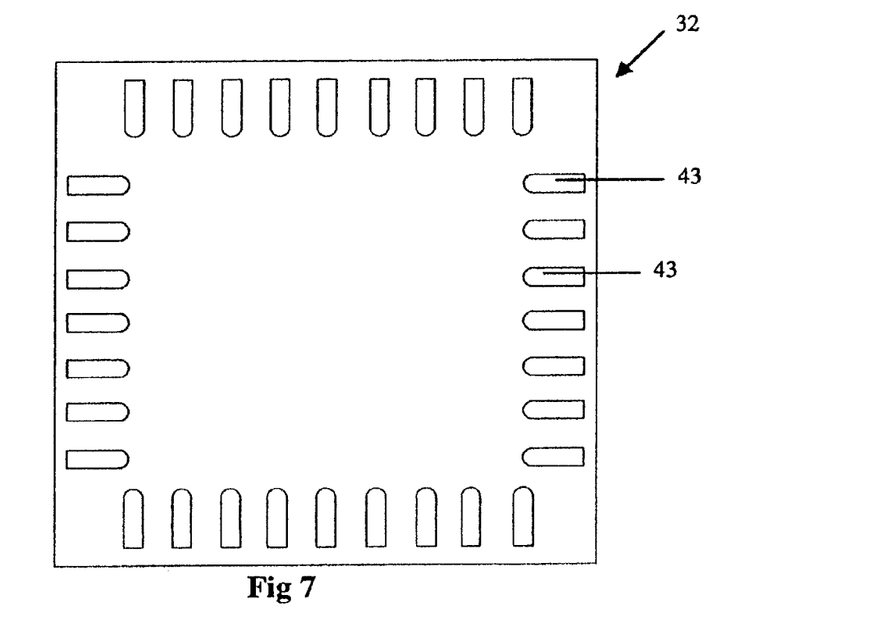
FIG. 7 is a showing of the die mounted to a support substrate with predeposited metal contact pads.
Figure 8:
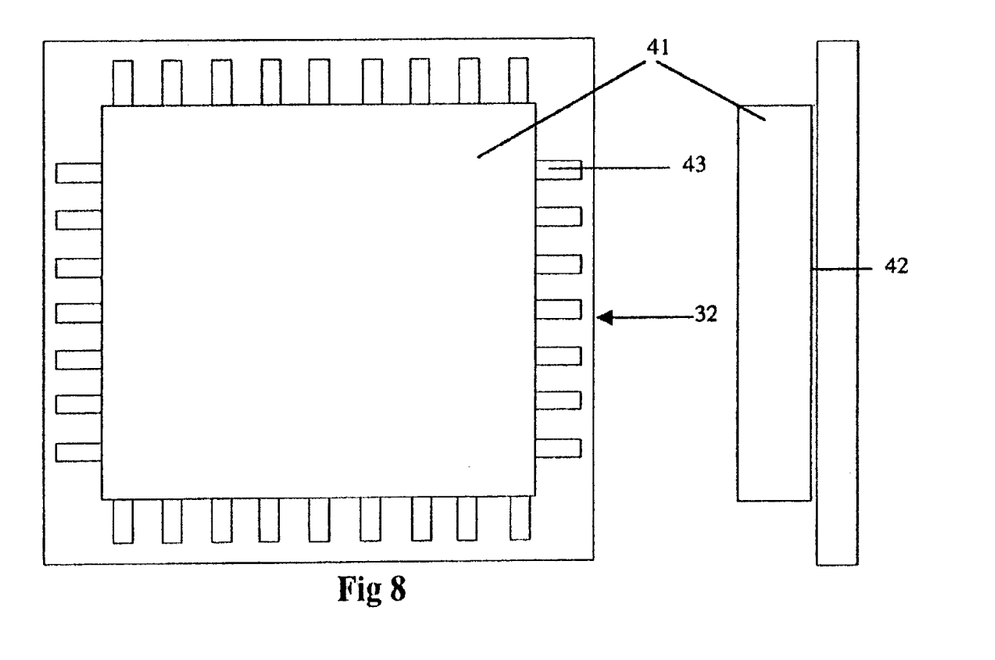
FIG. 8 shows the die mounted on the support substrate.

In FIG. 7 there is illustrated the placing of metal contact pads 43 (two of which are marked) onto the die 32. The pads are mounted to the gold bound pads 38 (shown in earlier Figures) using conventional techniques. In FIG. 8 the support substrate 41 is mounted onto the face of die 32. As shown, the adhesive underfill is placed against the top surface and the metal contact pads 43 are partially covered. The support layer 41 is then mounted onto the adhesive layer. A side view is also shown in this Figure.

The conductor used to shield the analog support electronics as discussed in connection with FIG. 5 may be a thermally evaporated or a sputtered metal layer. E-beam evaporators can produce potentially damaging x-rays and therefore are not recommended.

The source of fixed pattern noise, in which non-uniform gain results from non-uniform reflection and scattering of incoming light, is of particular concern for backthinned CMOS sensors such as chip 13 used in a proximity focused device in conjunction with a GaAs photocathode as shown in FIG. 1. Under bright conditions, with no applied high voltage, these sensors can be used to directly image the long wavelength light transmitted through the GaAs photocathode. The light transmitted by the GaAs cathode and detected by the CMOS anode is peaked between 800 and 1100 nm. However, as was set forth above in low light situations, the type vacuum imaging system illustrated employing an ordinary back thinned imager will produce non-uniform pixel gain and hence, non-uniform output when the sensor is uniformly illuminated. Although discussed and illustrated as deposited over the analog circuit area only, metal deposition can also be extended over the active pixel array. In such a case one obtains the benefit of addressing both the "high dielectric coating" FPN mechanism and that associated with the non-uniform optical properties of the underfill material. Yet, depositing the conductive layer across the entire surface including the pixel area is a very low cost way to reduce such FPN presumably by blocking or preventing the transmitted light or the reflected light from reaching the pixel section of the CMOS imager. Further this approach also appears to be quite robust physically. Whereas, this approach is most effective in considerably reducing this form of FPN a small amount of fixed pattern noise may remain after the metalization layer is applied. Although the reason is not entirely clear it is believed that the presence of the metal layer may itself interfere, with the analog support circuitry, and generate a very small amount of detectable fixed pattern noise. Yet, such FPN may be reduced from a performance limiting level of noise to a level equivalent to that seen on a bare die if care is exercised in designing the analog support circuitry for a die with the metal shield in place.

Figure 9:
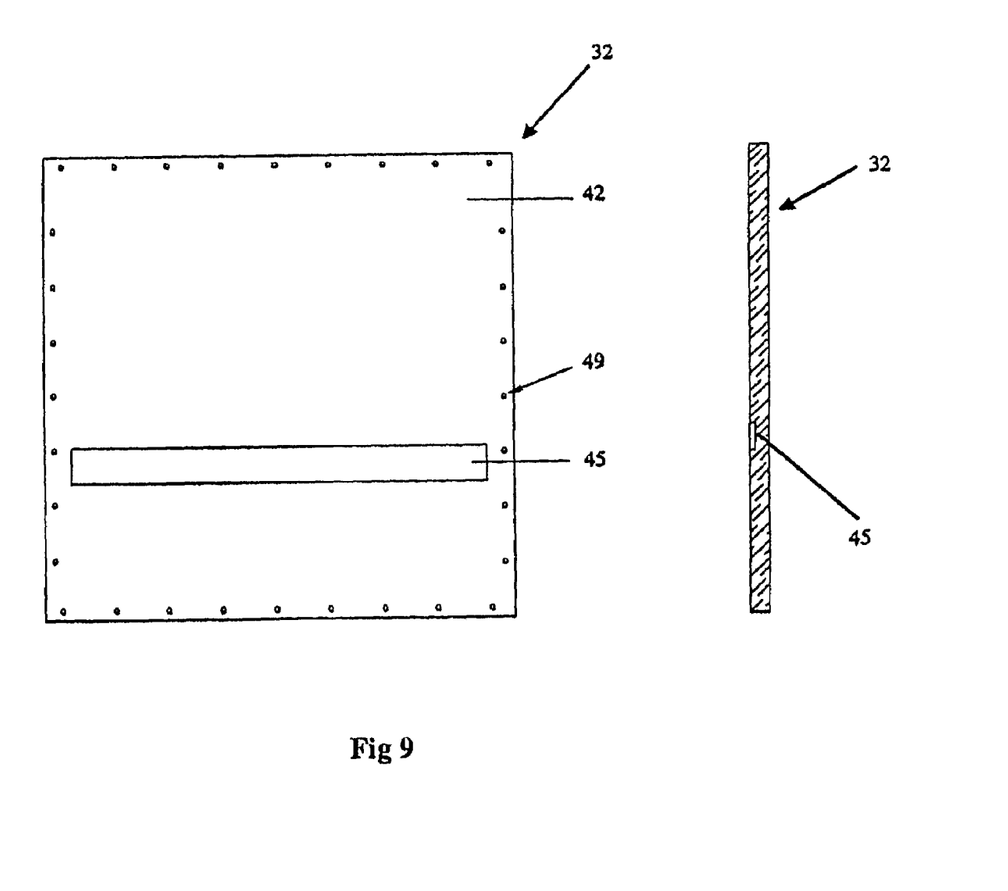
FIG. 9 shows a second embodiment of this invention in which the adhesive is selectively deposited onto the die as to leave open an area.
Figure 10:
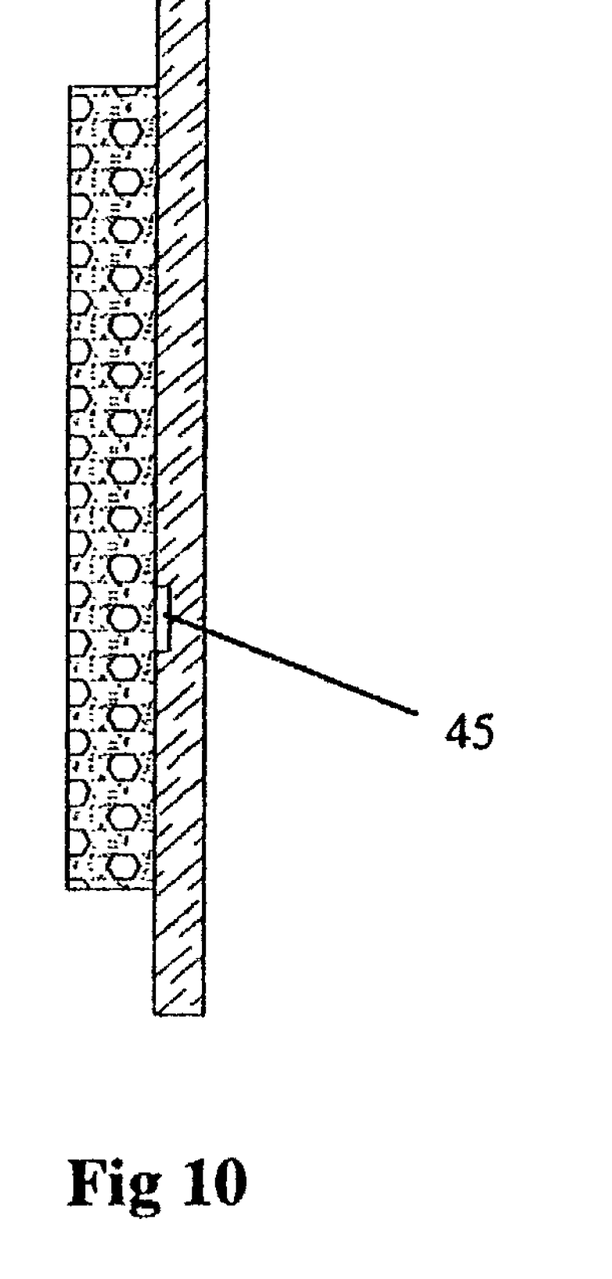
FIG. 10 illustrates the embodiment shown and discussed in connection with FIG. 9 in side view.

In FIGS. 9 and 10 an alternate embodiment is shown. In FIG. 9, a die of the configuration illustrated in FIG. 4 is described in connection with an alternate process. In this embodiment the die 32 is covered with an adhesive approximately 1 to 4 mils thick except for an exclusion zone 45 and except for the gold balls 49 bonded to underlying bond pads 38. A side view of the die with an adhesive coating except for the exclusion strip is also shown in this Figure. When support layer 32 is placed over adhesive 42, as shown in FIG. 10, there remains a void at 45, the area that corresponds to the area that was left uncovered when the adhesive was placed across the surface of die 41. This void may be left open to the vacuum when the die is placed into a vacuum environment for operation. The void will act as a low dielectric coating in area 45. If this area is sealed, for example at its edges by adhesive, again this area will act as a low dielectric coating and again the die structure with the exclusion will prevent the introduction of additional FPN problems. It is thus seen that either a conductive shield or a void above the analog circuitry area of the upper surface of the die prevents the problem of fixed pattern noise encountered without use of this invention.

Another embodiment is to use an anodic bond in lieu of the adhesive or underfill layer used in connection with the last embodiment described. In this embodiment a depression or through-hole is carved into the glass support substrate above the analog support circuitry. The bonded support glass specifies a low dielectric constant layer above the analog circuitry and operation is in accordance with the embodiment shown and discussed in connection with FIG. 10. The well in the support substrate of this embodiment can be generated by a number of techniques including ultrasonic machining or etching. Etching through either the die or support substrate and overlying dielectric coating accesses bond pads.

Figure 11:
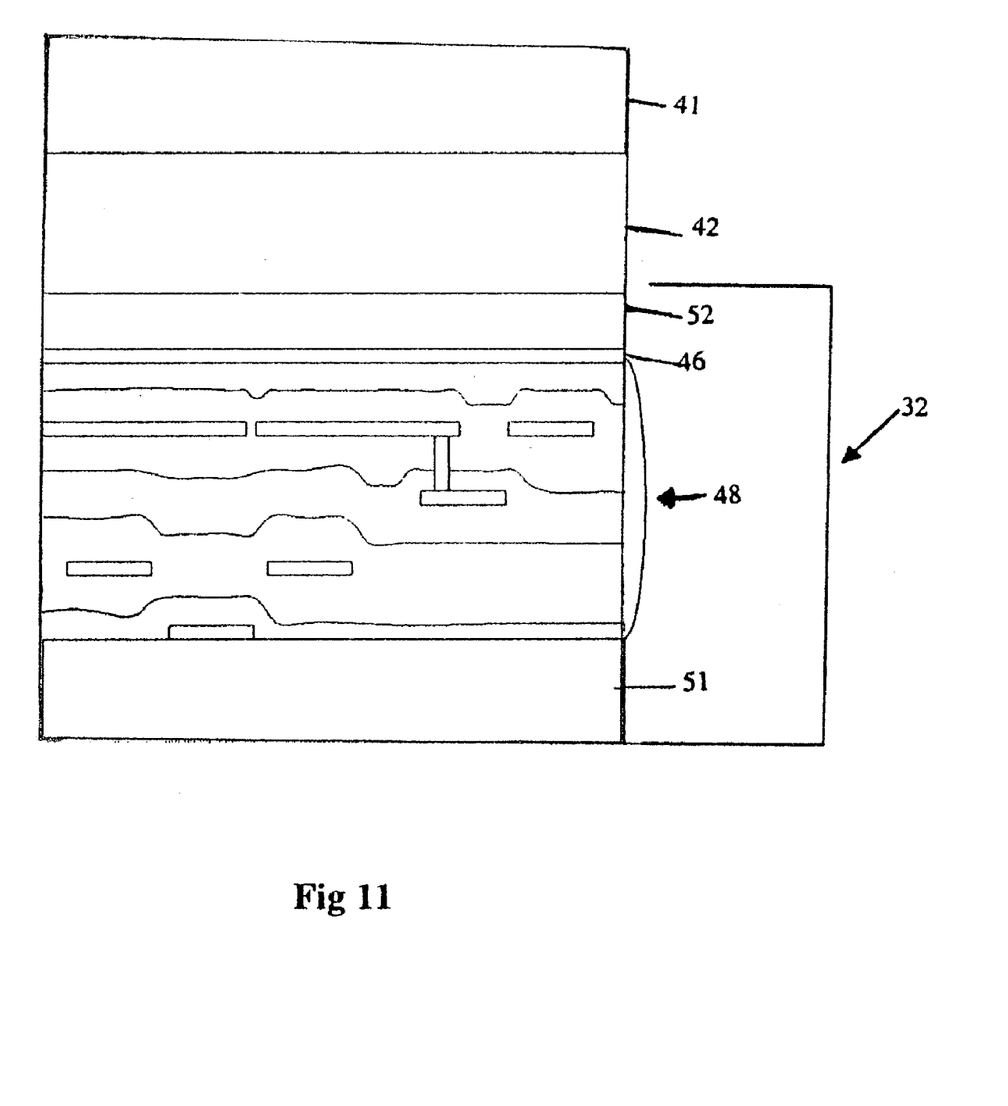
FIG. 11 shows another and the preferred embodiment of this invention in which an internal metallic shield is incorporated into the die at a proper area; and, FIG. 12 is a graph showing the improvement that this invention achieves.

A final embodiment and the preferred embodiment for a CMOS imager for use in a vacuum environment is to manufacture the die with a conductive shield placed internally in the CMOS structure. This is shown in FIG. 11 where a cross sectional view through the analog support electronics shields the internal analog section. In this embodiment a metal shield layer 46 has been added to the CMOS structure 32. In this device the silicon base layer 51 (to be back thinned) and the metal and dielectric layers associated with analog circuitry 48 as well as the upper surface of the CMOS imager of Silicon Oxynitride 52, the usual upper or front layer on a CMOS device is bonded to a support substrate 41 via one of the previously described methods such as a frit glass adhesive layer 42. In this case the CMOS imager is manufactured with the shielding layer 46 built in to the structure. The CMOS die in this embodiment, as illustrated, is designed to incorporate a metal shield over the column CDS circuitry and the analog circuitry. The resulting CMOS sensor in such a case will be immune to changes in the dielectric constant of the material overlying the front surface of the sensor. If this layer is taken into account within the circuit performance model, no additional FPN is introduced as a result of the shields presence. The incorporation of the shield 46 makes the die immune to FPN degradation associated with flip-chip bonding processes.

Figure 12:
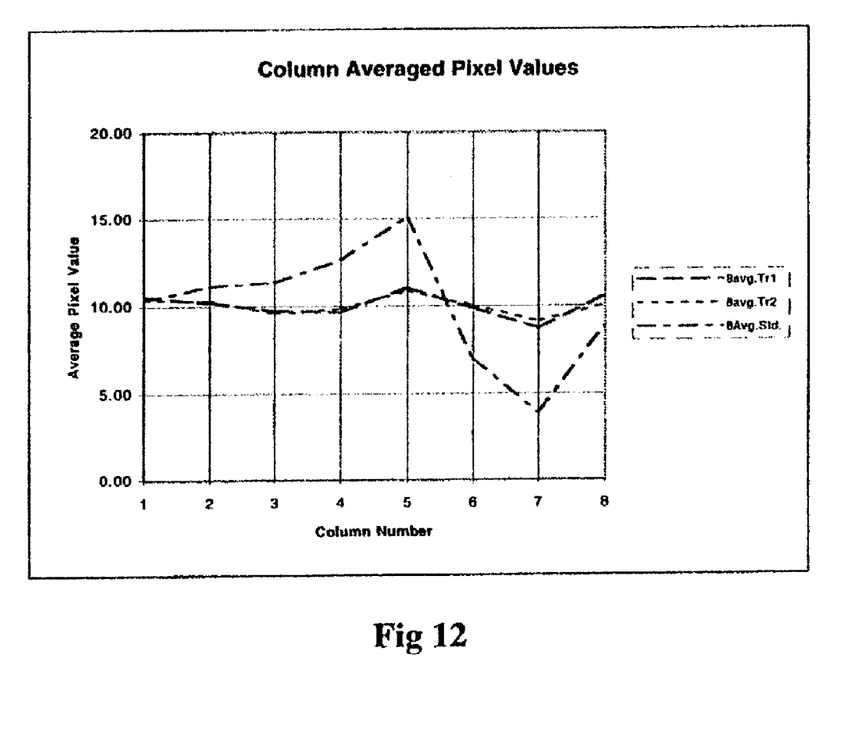

FIG. 12 shows a plot of the 8-column averaged pixel values for both a control sample bonded to a glass substrate using a high dielectric constant glass frit and two experimental samples. The 8-column average was accomplished by averaging the pixel values for a full column of the CMOS image and then averaging the repetitive 8-column blocks over the full horizontal extent of the image. This only captures the FPN that reoccurs on an 8-column basis but it provides a quick gauge as to the magnitude of the improvement on this particular type of die. A fast Fourier transform of the image is a more general technique that can be used to identify repetitive FPN problems. The experimental samples incorporate an intervening 1000 Å thick thermally evaporated aluminum layer between the surface of the CMOS die and the glass frit. Images were captured in the dark at equal gain settings. Offsets were adjusted to an average value of 10 counts. The maximum swing in the average pixel value was reduced by approximately a factor of 5. This 5× reduction in FPN was sufficient to reduce the problem from one that limited the low light signal to noise ratio of the sensor to a barely noticeable artifact.

The method by which a low dielectric constant layer is specified over sensitive portions of the CMOS die is dependent upon the choice of bond-down or "flip-chip" technique. Flip-chip techniques can be generally classified into two categories, ones that use an underfill or adhesive layer and those that do not. Frit glass bonds and epoxy bonds to a supporting substrate fall into the first category. Although many flip-chip processes begin by making electrical connections without any support below the die and follow up by wicking in an underfill material, it is difficult to control the physical extent of the underfill material using this technique. Conversely, the underfill material may be applied to the substrate or die in advance of the electrical bond via a patterned deposition. Through careful control of the application of the adhesive/underfill layer and careful control of the bonding cycle, a void can be left over the sensitive portions of the die. Another potential drawback of this technique is encountered upon backside thinning the die. After thinning the die, the area of the void is left without frontside support, and can constitute a fragile, stressed membrane. The total thickness of the membrane is often quite thin. In order to maintain high performance on a backside thinned CMOS imager, the silicon thickness is often on the same order as the pixel pitch. Pixel pitch in the state of the art CMOS imagers is on the order of approximately 5 microns and will continue to fall as design rules progress. Although the area of the die that is affected by a high dielectric coating may represent only ~20% of the total die area, the fragile nature of the unsupported film may impact device yield.

As previously stated, the area of the die that exhibits the greatest sensitivity to the high dielectric constant coating lies immediately adjacent to the active pixel array. The only portion of the die that needs to be thinned in order to achieve good backside imaging performance is in the area of the active pixel array. Accordingly, "area selective backside thinning" (ASBT) can be used to etch away the excess silicon from the backside of the die in the area of the active pixel array while the silicon underlying adjacent circuitry and bond pads is left thicker. This technique is more fully detailed in a simultaneously filed patent application entitled Backside Thinning of Image Array Devices, Ser. No. 10/891,877, incorporated herein by reference. The thicker layer, typically >25 microns thick, can be used to physically stabilize the unsupported membrane, thereby increasing device yield. In addition to the benefit provided to the physical stability of the backside bonded sensor, ASBT has been demonstrated to improve the yield of backside thinned die that do not incorporate the unsupported membrane. Backside thinning techniques typically incorporate both a bulk silicon removal technique followed by a selective wet chemical etch that stops on a chemically modified layer underlying the CMOS circuitry. A variety of silicon chemically selective stop etch techniques are documented and known to those skilled in the art. Although the root cause of the yield loss is not completely clear, it has been observed that chemically selective stop etch techniques are more likely to fail on CMOS imagers than on CCDs that incorporate identical stop layer structures. It has been observed that stop layer failures are most likely to occur in the area of the die that overlies CMOS support circuitry as opposed to the active pixel array. Consequently, the use of ASBT will supplement backside thinned CMOS yields whether or not the high dielectric constant coating exclusion area approach is used.

In the event that the active area metal coverage is not complete, this allows for front side testing of the die before flip-chip bonding. Further, by simply enlarging lines that are already on every CMOS die in a counterintuitive manner, one can achieve the desired end through increased shadowing of the photosensitive portion of the pixel.

It should be noted that the FPN associated with non-uniform underfill can be minimized by using a low open area ratio (OAR) metal layer over the active pixels. If for example, a 5% OAR shield layer were employed over an active pixel array that would normally have a 50% fill factor, the effective FPN associated with non-uniform underfill would be reduced by ~10×. Retention of some frontside light sensitivity can be very useful as the die can be optically tested before flip-chip bonding.

While this invention has been described in specific configurations, it should be readily recognized that it may be embodied in other forms and variations without departing from the spirit or essential characteristics thereof. The present embodiments are therefore to be considered illustrative and not restrictive, the scope of the invention being indicated by the appended claims.

What is claimed follows:

1. A CMOS chip for use in an imaging system while avoiding fixed pattern noises comprising
   a die comprising an array of pixel sensors and analog and digital support electronics at the front surface of said die,
   a silicon layer at the back surface of said die,
   a support structure for the chip on the front surface comprising a conductive shield in direct contact with said front surface of said chip at least overlying said analog support electronics and said array of pixel sensors of said die to reduce fixed pattern noises, said support structure to maintain the shape and configuration of the chip when said silicon back surface layer is thinned to an epitaxial layer at least in areas corresponding to said array of pixel sensors for imaging exposure of said pixels through said thinned epitaxial layer.

2. The CMOS chip of claim 1 in which conductive shield comprises aluminum.

3. The CMOS chip of claim 2 in which the aluminum is about 1000 angstroms thick.

4. The CMOS chip of claim 1 in which said conductive shield is deposited by a sputtering process.

5. The CMOS chip of claim 1 in which the conductive shield is thermally evaporated onto the front surface of the die.

6. A CMOS chip for use in an imaging system with reduced fixed pattern noise consisting essentially of a die comprising,
   a silicon layer at the back surface of said die supporting a pixel addressing and analog support electronics for said die,
   a support structure for the chip on the front surface of said die directly in contact with the front surface of said chip including a conductive shield positioned at least overlying the pixel addressing and analog support electronics of said die to maintain the shape and configuration of the chip when the back surface silicon layer has been thinned to an epitaxial surface layer for exposure of said pixel addressing electronics through said epitaxial surface layer and to reduce fixed pattern noise during imaging, said support structure at the front surface of said die comprising an adhesive underfill material and a front surface support layer in which said adhesive and said support layer each have a thermal coefficient of expansion generally matching the thermal coefficient of expansion of the silicon layer at the back surface of said die.

7. The CMOS chip of claim 6 in which said conductive shield is sufficiently robust as to cover the front surface of the chip including the active pixel array to block greater than about 80% of the light incident on the front surface of the die from reaching the pixels of the chip.

8. An imaging system with reduced fixed pattern noises comprising placing a CMOS chip comprising:
   a die consisting essentially of an array of pixel sensors and analog and digital support electronics at its front surface positioned on a silicon layer at its back surface;
   a conductive shield positioned at the front surface of said die at least overlying said pixel sensors and analog support electronics of said die to reduce fixed pattern noise during imaging; said conductive shield being positioned on an adhesive underfill material positioned on the front surface side of said die underlying a supporting layer;
   said conductive shield, said underfill material and said supporting layer comprising a support structure for the chip on the front surface thereof to maintain the shape and configuration of the chip when said silicon layer on the back side of said die is thinned to an epitaxial surface layer, said conductive shield and said underfill material each having a thermal coefficient of expansion generally matching the thermal coefficient of expansion of the silicon layer at the back surface of said die;
   in position in a proximity focused imaging system comprising: a photocathode mounted on a transparent base; the CMOS chip; and a vacuum system between the photocathode and the CMOS chip with the back surface of the CMOS chip facing said photocathode and said photocathode and said CMOS chip positioned within the vacuum facing each other, the incoming electron image from the facing photocathode feeding to the back surface of said CMOS chip; and exposing said photocathode to a light image as to cause electrons from said photocathode to travel to the back surface of said CMOS chip.

9. A CMOS chip for use in an imaging system with reduced fixed pattern noise comprising a die comprising,
   a silicon layer at the back surface of said die supporting a pixel addressing or analog support electronics for said die,
   a support structure for the chip on the front surface of said die including a conductive shield positioned at least overlying the pixel addressing or analog support electronics of said die to maintain the shape and configuration of the chip when the back surface silicon layer has been thinned to an epitaxial surface layer and to reduce fixed pattern noise during imaging, said support structure at the front surface of said die comprising an adhesive underfill material and a front surface support layer in which said adhesive and said support layer each have a thermal coefficient of expansion generally matching the thermal coefficient of expansion of the silicon layer at the back surface of said die
   said adhesive material including a void between said support layer and said front surface of said die over that portion of the chip associated with pixel addressing or analog support electronics.

* * * * *